(12) United States Patent
Jin

(10) Patent No.: US 8,703,614 B2
(45) Date of Patent: Apr. 22, 2014

(54) METAL ORGANIC CHEMICAL VAPOR DEPOSITION APPARATUS AND METHOD

(71) Applicant: LIGADP Co., Ltd., Seongnam (KR)

(72) Inventor: Joo Jin, Yongin (KR)

(73) Assignee: LIGADP Co., Ltd., Seongnam (KR)

( * ) Notice: Subject to any disclaimer, the term of this patent is extended or adjusted under 35 U.S.C. 154(b) by 0 days.

(21) Appl. No.: 13/717,587

(22) Filed: Dec. 17, 2012

(65) Prior Publication Data

US 2013/0109161 A1  May 2, 2013

(30) Foreign Application Priority Data

Oct. 14, 2009  (KR) .................. 10-2009-0097857

(51) Int. Cl.
  *H01L 21/44* (2006.01)
(52) U.S. Cl.
  USPC .................................. 438/681; 257/E51.013
(58) Field of Classification Search
  USPC .................................. 438/681; 257/E51.013
  See application file for complete search history.

(56) References Cited

U.S. PATENT DOCUMENTS

| 6,350,321 B1 | 2/2002 | Chan et al. |
|---|---|---|
| 6,555,284 B1 | 4/2003 | Boroson et al. |
| 6,827,788 B2 | 12/2004 | Takahashi |
| 2002/0078892 A1 | 6/2002 | Takahashi |
| 2007/0254390 A1 | 11/2007 | Bour et al. |
| 2009/0148704 A1 | 6/2009 | Takasuka et al. |
| 2009/0194026 A1 | 8/2009 | Burrows et al. |
| 2012/0024227 A1 | 2/2012 | Takasuka et al. |

FOREIGN PATENT DOCUMENTS

| JP | 07130643 A | 5/1995 |
|---|---|---|
| KR | 20020081730 | 10/2002 |
| KR | 20070049867 A | 5/2007 |

OTHER PUBLICATIONS

Office Action dated Dec. 1, 2010 for Korean Patent Application No. 10-2009-0097857 (8 pages).
Notice of Allowance dated Nov. 1, 2011 for Korean Patent Application No. 10-2009-0097857 (5 pages).
Office Action dated Jun. 18, 2012 for Chinese Patent Application No. 201010294728.1 (7 pages).
Office Action dated Feb. 19, 2013 for Taiwan Patent Application No. 099133319 (3 pages).
Office Action dated Nov. 21, 2013 for Taiwan Patent Application No. 099133319 (11 pages).

*Primary Examiner* — Michelle Mandala
(74) *Attorney, Agent, or Firm* — Perkins Coie LLP

(57) ABSTRACT

A metal organic chemical vapor deposition apparatus includes reaction chambers in which nitride layers is deposited on a substrate using a group III-V material, a buffer chamber connected to the reaction chambers and in which a transfer robot is disposed to transfer the substrate into the reaction chambers, a gas supply device configured to selectively supply one or more of hydrogen, nitrogen, and ammonia gases into the buffer chamber so that when the buffer chamber communicates with one of the reaction chambers, the buffer chamber has the same atmosphere as an atmosphere of the reaction chamber, and a heater disposed in the buffer chamber. Nitride layers are deposited on a substrate in the reaction chambers, and the temperature and gas atmosphere of the buffer chamber are adjusted such that when the substrate is transferred, epitaxial layers formed on the substrate can be stably maintained.

5 Claims, 4 Drawing Sheets

METAL ORGANIC CHEMICAL VAPOR DEPOSITION APPARATUS AND METHOD

RELATED APPLICATIONS

This application is a divisional of U.S. patent application Ser. No. 12/893,440, filed on Sep. 29, 2010, which claims the benefit of Korean Patent Application No. 10-2009-0097857, filed on Oct. 14, 2009 in the Korean Intellectual Property Office, the entire contents of which are incorporated herein in their entirety by reference.

BACKGROUND OF THE INVENTION

1. Field of the Invention

The present invention relates to a metal organic chemical vapor deposition apparatus and method, and more particularly, to a metal organic chemical vapor deposition apparatus including a plurality of chambers and a metal organic chemical vapor deposition method using the apparatus.

2. Description of the Related Art

Nitrides are known as materials for fabricating light emitting diodes. Generally, a light emitting diode has a stacked structure constituted by a buffer layer formed of gallium nitride crystals on a sapphire substrate, an n-type doping layer formed of n-type GaN crystals, an active layer formed of an indium gallium nitride (InGaN), and a p-type doping layer formed of p-type GaN crystals.

Deposition processes of such a light emitting diode are performed in series in the same chamber. About 4 to 10 hours are spent for the processes. After the first process is performed, the chamber has to be cleaned, and then the second process is performed. Usually, the chamber is manually cleaned by a worker. Therefore, the efficiency of a metal organic chemical vapor deposition (MOCVD) apparatus is very low.

SUMMARY OF THE INVENTION

The present invention provides a metal organic chemical vapor deposition apparatus including a buffer chamber connected to a plurality of reaction chambers and configured to be adjusted in temperature and inside gas atmosphere so as to improve the efficiency of a metal organic chemical vapor deposition process, and a metal organic chemical vapor deposition method using the apparatus.

According to an aspect of the present invention, a metal organic chemical vapor deposition apparatus includes: a plurality of reaction chambers in which nitride layers are deposited on a substrate by using a group III-V material; a buffer chamber connected to the reaction chambers and in which a transfer robot is disposed to transfer the substrate into and out of the reaction chambers; a gas supply device configured to selectively supply one or more of hydrogen gas, nitrogen gas, and ammonia gas into the buffer chamber so that when the buffer chamber communicates with one of the reaction chambers, the buffer chamber has the same gas atmosphere as a gas atmosphere of the reaction chamber; and a heater disposed in the buffer chamber to heat the buffer chamber.

According to another aspect of the present invention, a metal organic chemical vapor deposition method includes: transferring a substrate from a buffer chamber into a first reaction chamber; growing an undoping layer, an n-type doping layer, and an active layer on the substrate in the first reaction chamber; transferring the substrate from the first reaction chamber to a second reaction chamber; and growing a p-type doping layer on the active layer.

According to another aspect of the present invention, a metal organic chemical vapor deposition apparatus includes: first and second reaction chambers in which a nitride layer is deposited on a substrate by using a group III-V material; a buffer chamber connected to the first and second reaction chambers and in which a transfer robot is disposed to transfer the substrate into and out of the first and second reaction chambers; and a gas supply device configured to supply a process gas selectively into the first reaction chamber, the second reaction chamber, and the buffer chamber.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
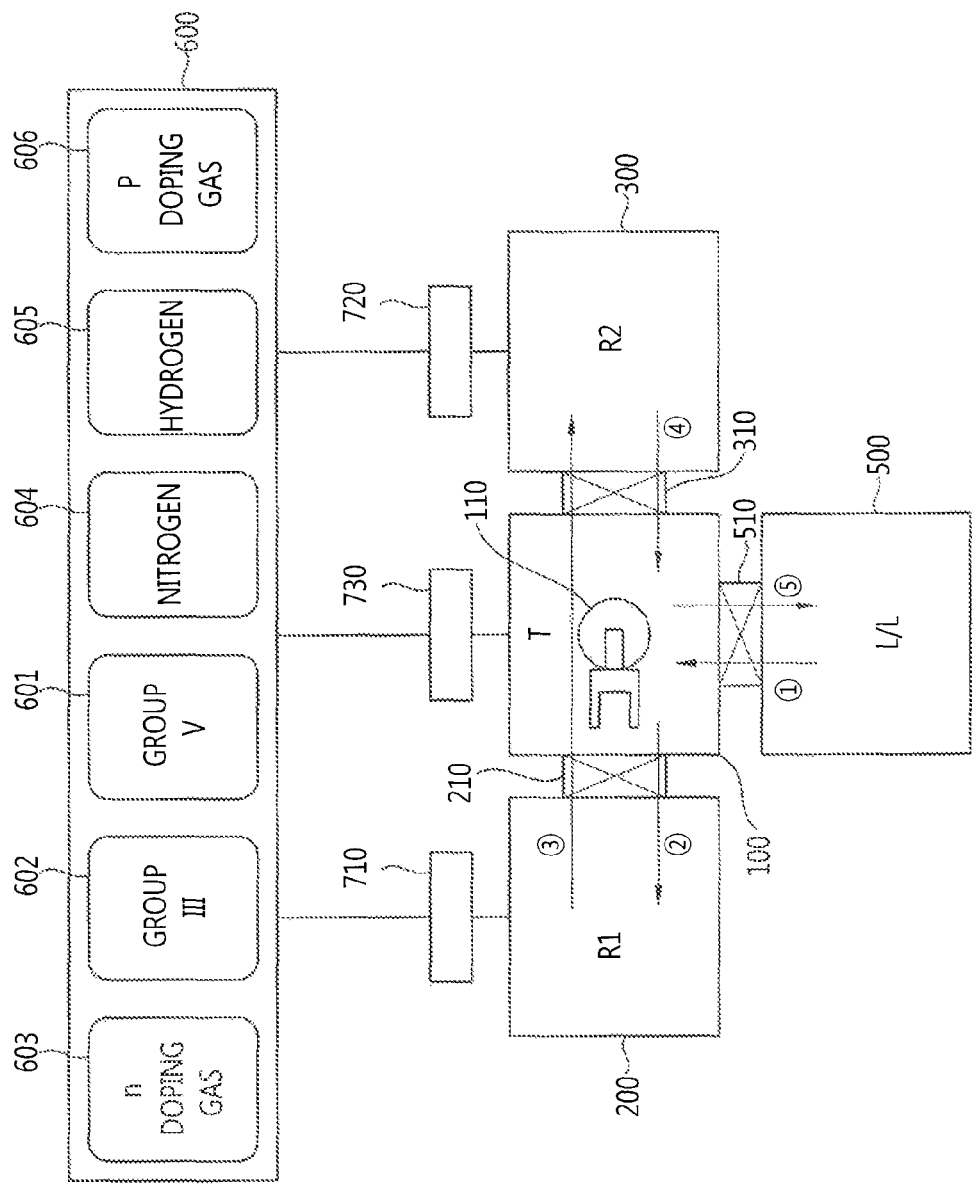
FIG. 1 is a plan view illustrating a metal organic chemical vapor deposition (MOCVD) apparatus according to an exemplary embodiment of the present invention.

A metal organic chemical vapor deposition (MOCVD) apparatus will now be described according to exemplary embodiments of the present invention. FIG. 1 is a plan view illustrating a MOCVD apparatus according to an exemplary embodiment of the present invention.

As shown in FIG. 1, the MOCVD apparatus includes a load-lock chamber 500, a buffer chamber 100, a plurality of reaction chambers 200 and 300.

A substrate 240 or a susceptor 230 may be loaded or unloaded through the load-lock chamber 500. A transfer robot 110 may be installed in the buffer chamber 100. The transfer robot 110 may transfer the substrate 240 or the susceptor 230 into the load-lock chamber 500 or the reaction chambers 200 and 300. The reaction chambers 200 and 300 may be connected to the buffer chamber 100.

In the current embodiment, the substrate 240 may be a wafer. Alternatively, the substrate 240 may be a satellite susceptor that can be detachably placed on the susceptor 230 and support at least one wafer.

The reaction chambers 200 and 300 may include a first reaction chamber 200 and a second reaction chamber 300.

In this case, a buffer layer, an n-type doping layer, an undoping gallium nitride (GaN) layer, and an active layer may be sequentially deposited on the substrate 240 in the first reaction chamber 200, and a p-type doping layer may be deposited on the active layer of the substrate 240 in the second reaction chamber 300.

Alternatively, a buffer layer, an n-type doping layer, and an undoping GaN layer may be sequentially deposited on the substrate 240 in the first reaction chamber 200, and an active layer and a p-type doping layer may be deposited in the second reaction chamber 300.

A gas supply device 600 may be provided to supply gases to the buffer chamber 100, the first reaction chamber 200, and the second reaction chamber 300.

As shown in FIG. 1, the gas supply device 600 may include a nitrogen gas supply device 604, a hydrogen gas supply device 605, a group III gas supply device 602, a group V gas supply device 601, an n-type doping gas supply device 603, and a p-type doping gas supply device 606.

The group III gas supply device 602 may supply trimethyl gallium (TMG) and trimethyl indium (TMI). The group V gas supply device 601 may supply ammonia (NH3). The n-type doping gas supply device 603 may supply one of silane (SiH4) and germanium tetrahydride (GeH4). The p-type doping gas supply device 606 may supply isocyclopentadienyl-magnesium (Cp2Mg).

A first gas distributor 710 may supply such process gases from the gas supply device 600 to the first reaction chamber 200; a second gas distributor 720 may supply such process gases from the gas supply device 600 to the second reaction chamber 300; and a third gas distributor 730 may supply such process gases to the buffer chamber 100.

The first gas distributor 710 may supply nitrogen, hydrogen, group III, group V, and n-type doping gases to the first reaction chamber 200. The second gas distributor 720 may supply hydrogen, group III, group V, and p-type doping gases to the second reaction chamber 300, and the third gas distributor 730 may selectively distribute nitrogen and hydrogen gases to the buffer chamber 100. Alternatively, if necessary, the third gas distributor 730 may supply ammonia (NH3) to the buffer chamber 100.

Figure 2:
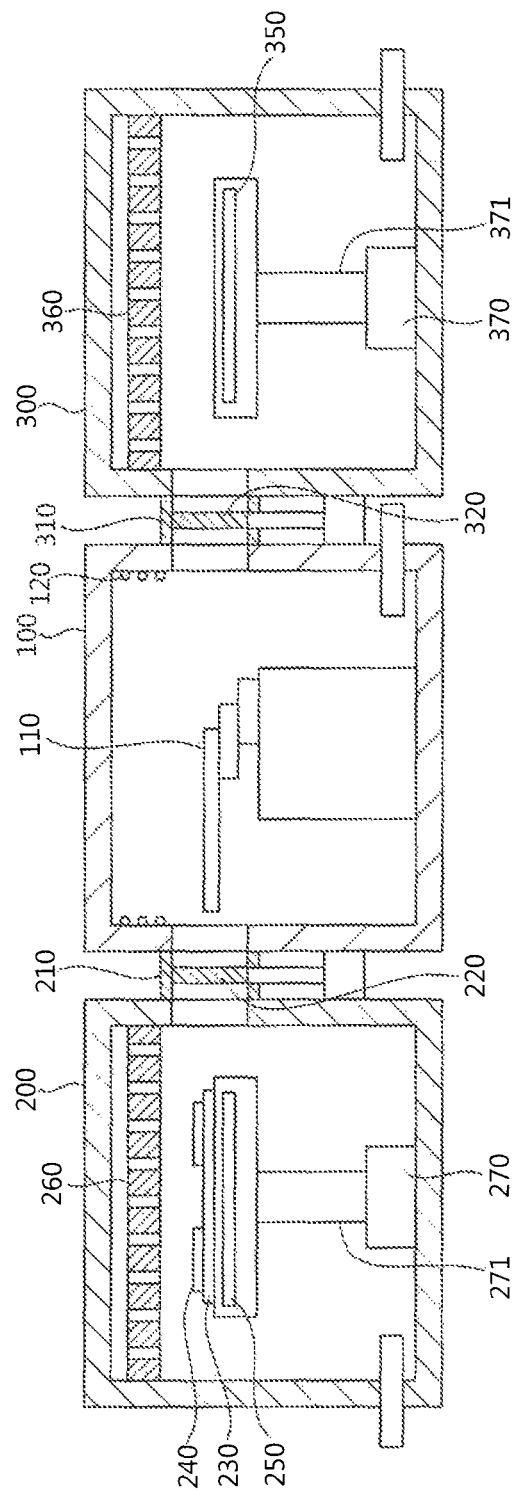
FIG. 2 is a sectional view illustrating a first reaction chamber, a second reaction chamber, and a buffer chamber of the MOCVD apparatus according to an exemplary embodiment of the present invention.

FIG. 2 is a sectional view illustrating the first reaction chamber 200, the second reaction chamber 300, and the buffer chamber 100 of the MOCVD apparatus.

As shown in FIG. 2, shower head 260 may be provided to eject process gases downwardly in the first reaction chamber, and the susceptor 230 may be disposed under the shower head 260. Shower head 360 may be provided to eject process gases downwardly in the second reaction chamber 300, and the susceptor 230 may be disposed under the shower head 360.

Heaters 250 and 350 may be installed at positions on which the susceptor 230 may be placed so as to heat the susceptor 230 to a high temperature. The heaters 250 and 350 may be tungsten heaters, ceramic heaters, or radio frequency heaters.

The susceptor 230 may be rotated by rotary devices 270 and 370. The susceptor 230 may be detachably installed on the top side of rotation shaft 271 or 371 of the rotary device 270 or 370.

Gate 210 is provided at wall of the first reaction chamber 200 so that the substrate 240 or the susceptor 230 can be transferred through the gate 210. Gate 310 is provided at wall of the second reaction chamber 300 so that the substrate 240 or the susceptor 230 can be transferred through the gate 310. Gate valves 220 and 320 may be provided at the gates 210 and 310 to open or close the gates 210 and 310. The reaction chambers 200 and 300 are connected to the buffer chamber 100 through the gates 210 and 310.

The transfer robot 110 is installed in the buffer chamber 100 to transfer a wafer or the susceptor 230. The transfer robot 110 may be made of heat-resistant materials so that the transfer robot 110 can operate at a temperature of about 1000° C. A heater 120 may be installed in the buffer chamber 100 to heat the inside of the buffer chamber 100 to about 600° C. to about 900° C. The heater 120 may be an induction heating type RF heater 120.

A metal organic chemical vapor deposition (MOCVD) method will now be described according to an exemplary embodiment of the present invention.

Figure 3:
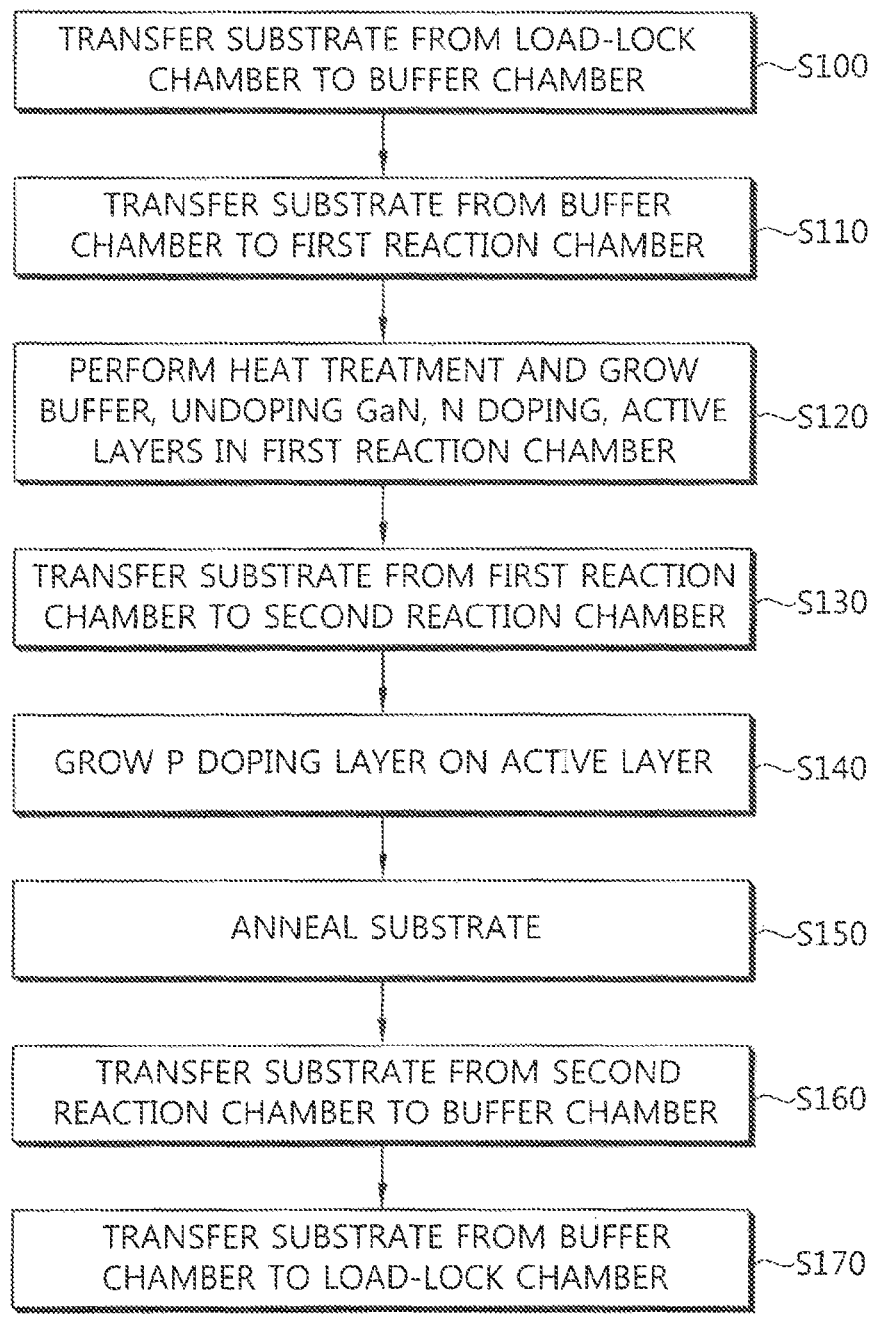
FIG. 3 is a flowchart for explaining a MOCVD method for annealing a substrate in the second reaction chamber according to an exemplary embodiment of the present invention.
Figure 4:
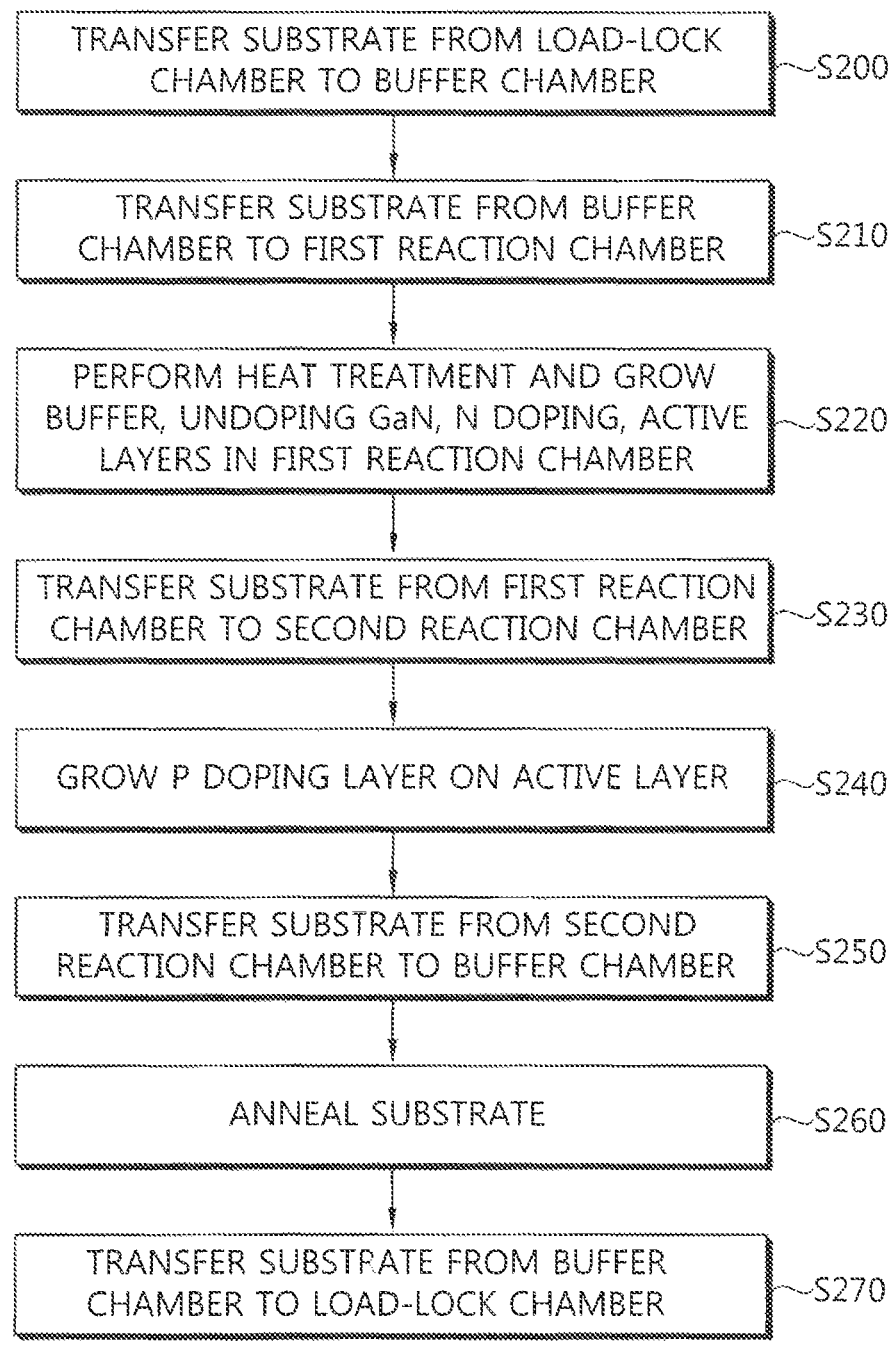
FIG. 4 is a flowchart for explaining a MOCVD method for annealing a substrate in the buffer chamber according to an exemplary embodiment of the present invention.

FIGS. 3 and 4 are flowcharts for explaining a MOCVD method according to exemplary embodiments of the present invention. FIG. 3 is a flowchart for explaining an annealing process performed in the second reaction chamber according to an exemplary embodiment of the present invention. FIG. 4 is a flowchart for explaining an annealing process performed in the buffer chamber according to an exemplary embodiment of the present invention.

First, a substrate 240 is carried into the load-lock chamber 500 and placed in position. The transfer robot 110 installed in the buffer chamber 100 picks up a non-processed substrate 240 or the susceptor 230 in the load-lock chamber 500 and carries it into the buffer chamber 100. Thereafter, a gate 510 connecting the load-lock chamber 500 and the buffer chamber 100 is closed (S100, S200).

At this time, the inside temperature of the buffer chamber 100 may be decreased due to connection with the load-lock chamber 500. Therefore, after the gate 510 is closed, it may be necessary to heat the inside of the buffer chamber 100 to keep the inside of the buffer chamber 100 at a preset temperature (for example, 600° C. to 900° C.). For this, a temperature detector such as a pyrometer may be installed on the buffer chamber 100.

When the gate 210 disposed between the buffer chamber 100 and the first reaction chamber 200 is opened, the transfer robot 110 installed in the buffer chamber 100 transfers the substrate 240 or the susceptor 230 into the first reaction chamber 200 (S110, S210). At this time, the inside of the first reaction chamber 200 may be kept at a temperature of about 1000° C. to about 1200° C. After the transfer robot 110 transfers the substrate 240 or the susceptor 230 into the first reaction chamber 200, the transfer robot 110 returns to the buffer chamber 100. Then, the gate 210 between the buffer chamber 100 and the first reaction chamber 200 is closed by the grate valve 220 (S110, S210).

Thereafter, the inside of the first reaction chamber 200 is filled with hydrogen gas, and the substrate 240 or the susceptor 230 is heated for about 10 minutes to 20 minutes (a heat treatment process). This heat treatment process is a cleaning process for removing an unnecessary layer such as an oxide layer formed on the substrate 240. Before the heat treatment process, the inside of the buffer chamber 100 may be filled with hydrogen or ammonia gas.

After the heat treatment process in the first reaction chamber 200, trimethyl gallium (TMG) and ammonia gases are supplied into the first reaction chamber 200 that is kept in the hydrogen atmosphere. Then, a gallium nitride (GaN) buffer layer is grown for about 30 minutes. While the buffer layer is grown, the substrate 240 may be kept at a relatively low temperature of about 450° C. to 600° C. The buffer layer may be grown to a thickness of about 20 nm.

After the buffer layer is grown, the inside of the first reaction chamber 200 is heated to increase the temperature of the substrate 240 to about 1000° C. to 1100° C., for example, 1030° C. to 1080° C. As a result, an undoping gallium nitride (GaN) layer is grown on the buffer layer. The undoping GaN layer may be grown to a thickness of about 3 μm during about 60 minutes. The buffer layer and the undoping GaN layer formed on the substrate 240 (for example, a sapphire substrate) may improve electrode characteristics and crystal growth efficiency of a gallium nitride thin film.

Next, an n-type doping layer is grown on the undoping GaN layer. For this, the inside of the first reaction chamber 200 is kept at a temperature of about 1000° C. to about 1100° C. Trimethyl gallium (TMG) gas, ammonia (NH3) gas, and doping gas such as silane (SiH4) gas are supplied as process gases under a hydrogen atmosphere. As a result, an n-type doping layer doped with Si is grown. The n-type doping layer may be grown to a thickness of about 3 µm during about 60 minutes.

Next, an active layer is grown on the n-type doping layer. The active layer may have a single quantum well (SQW) structure or a multi quantum well (MQW) structure with a plurality of quantum well layers.

The inside atmosphere of the first reaction chamber 200 is replaced with a nitrogen atmosphere to grow the active layer. While adjusting the temperature of the substrate 240 in the range from about 700° C. to 900° C. during about 80 minutes, the active layer is grown to a thickness of about 100 nm. If the active layer has a multi quantum well (MQW) structure, a quantum barrier layer and a quantum well layer having different indium contents are alternately formed. In this case, temperature may be repeatedly varied to control the growth of the active layer (S120, S220).

After the growth of the active layer is completed in the first reaction chamber 200, the inside of the buffer chamber 100 may be kept in the same gas atmosphere and temperature as the inside of the first reaction chamber 200. For example, if the inside atmosphere of the first reaction chamber 200 is nitrogen, the inside atmosphere of the buffer chamber 100 is replaced with a nitrogen atmosphere.

After adjusting the inside gas atmosphere and temperature of the buffer chamber 100, the gate 210 disposed between the first reaction chamber 200 and the buffer chamber 100 is opened. The transfer robot 110 transfers the substrate 240 or the susceptor 230 from the first reaction chamber 200 into the buffer chamber 100 through the opened gate 210.

Since the insides of the buffer chamber 100 and the first reaction chamber 200 are kept under the same atmosphere and temperature while the substrate 240 is transferred, the nitride layer formed on the substrate 240 can be stably kept.

Thereafter, the gate 210 disposed between the first reaction chamber 200 and the buffer chamber 100 is closed. Then, the substrate 240 or the susceptor 230 is transferred to the gate 310 of the second reaction chamber 300 by the transfer robot 110.

After that, the insides of the buffer chamber 100 and the second reaction chamber 300 are adjusted to the same gas atmosphere and temperature. For example, if the inside of the second reaction chamber 300 is kept under a hydrogen atmosphere to form a p-type doping layer, the inside of the buffer chamber 100 is also kept at a hydrogen atmosphere.

After adjusting the inside gas atmosphere and temperature of the buffer chamber 100, the gate 310 disposed between the second reaction chamber 300 and the buffer chamber 100 is opened. Then, the substrate 240 or the susceptor 230 is transferred into the second reaction chamber 300 by the transfer robot 110. Thereafter, the transfer robot 110 returns to the inside of the buffer chamber 100. Then, the gate 310 disposed between the buffer chamber 100 and the second reaction chamber 300 is closed. At this time, the inside of the second reaction chamber 300 is kept under a hydrogen atmosphere (S130, S230).

While a process is performed in the second reaction chamber 300, a process is performed on a new substrate or susceptor in the first reaction chamber 200 so as to improve the process efficiency. For this, after the substrate 240 or the susceptor 230 is transferred from the buffer chamber 100 to the second reaction chamber 300, the transfer robot 110 picks up a non-processed substrate or susceptor from the load-lock chamber 500 and carries the non-processed substrate or susceptor into the buffer chamber 100. Then, the transfer robot 110 transfers the non-processed substrate or the susceptor into the first reaction chamber 200 (S110, S210).

Processes are continuously performed in the buffer chamber 100, the first reaction chamber 200, and the second reaction chamber 300 according to a preset sequence, so that a plurality of substrates 240 or susceptors 230 can be automatically and rapidly processed.

Meanwhile, the inside of the second reaction chamber 300 is heated to increase the temperature of the substrate 240 to a temperature of about 900° C. to 950° C. to continuously form the p-type doping layer. After the temperature of the substrate 240 reaches a preset temperature, a process gas is supplied into the second reaction chamber 300. As a process gas for forming a p-type doping layer, ammonia gas, trimethyl (TMG) gas, or isocyclopentadienyl-magnesium (Cp2Mg) gas may be supplied. while the process gas is supplied into the second reaction chamber 300 for about 15 minutes, the p-type doping layer is grown to a thickness of about 200 nm (S140, S240).

After the p-type doping layer is formed, the inside of the second reaction chamber 300, or the substrate 240 or the susceptor 230 may be cooled to a temperature of about 600° C. to 700° C. In addition, if necessary, the inside atmosphere of the second reaction chamber 300 may be replaced with a nitrogen atmosphere, and an annealing process may be performed in the second reaction chamber 300 for a predetermined time as shown in FIG. 3 (S150). Owing to the annealing process, the resistance of the p-type doping layer doped with a p-type dopant may be decreased. After the annealing process, the gate 310 between the second reaction chamber 300 and the buffer chamber 100 is opened. Then, the transfer robot 110 transfers the substrate 240 or the susceptor 230 from the second reaction chamber 300 into the buffer chamber 100 through the opened gate 310 (S160). Thereafter, the gate 310 is closed.

In another embodiment, an annealing process may be performed in the buffer chamber 100 as shown in FIG. 4. For example, after the p-type doping layer is formed (S240), the gate 310 between the second reaction chamber 300 and the buffer chamber 100 is opened. The transfer robot 110 transfers the substrate 240 or the susceptor 230 from the second reaction chamber 300 into the buffer chamber 100 through the opened gate 310 (S250). Thereafter, the gate 310 is closed.

The inside atmosphere of the buffer chamber 100 is already nitrogen. Since the inside of the buffer chamber 100 is kept at a temperature of about 600° C. to 900° C., an annealing process can be performed for a predetermined time in the buffer chamber 100 after the gate 310 disposed between the second reaction chamber 300 and the buffer chamber 100 is closed (S260).

After the annealing process performed as shown in FIG. 3 or 4, the substrate 240 or the susceptor 230 is placed in the buffer chamber 100, and the gate 510 between the load-lock chamber 500 and the buffer chamber 100 is opened. Then, the transfer robot 110 transfers the substrate 240 or the susceptor 230 to the load-lock chamber 500 (S170, S270). Thereafter, the substrate 240 or the susceptor 230 is transferred for performing a light emitting diode manufacturing process.

As described above, since nitride layers are deposited in the plurality of reaction chambers 200 and 300, the process efficiency can be improved. In addition, when a susceptor 730 or a substrate 240 on which nitride layers are deposited is transferred, the inside gas atmosphere and temperature of the buffer chamber 100 is kept equal to those of a reaction chamber connected to the buffer chamber 100, so that deposited nitride layers can be stably maintained while the substrate 240 or the susceptor 230 is transferred.

According to the present invention, nitride layers are deposited on a substrate in the reaction chambers, and the temperature and gas atmosphere of the buffer chamber are adjusted in a manner such that when the substrate is transferred from the reaction chambers, epitaxial layers formed on the substrate can be stably maintained. Thus, the process efficiency can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, future modifications to the embodiments of the present invention cannot depart from the technical scope of the present invention.

What is claimed is:

1. A metal organic chemical vapor deposition method comprising:
    transferring a substrate from a buffer chamber into a first reaction chamber;
    heating the substrate;
    growing an undoping layer, an n-type doping layer, and an active layer on the substrate in the first reaction chamber;
    transferring the substrate from the first reaction chamber to a second reaction chamber;
    forming a p-type doping layer on the active layer; and
    after the forming of the p-type doping layer, annealing the substrate.

2. The metal organic chemical vapor deposition method of claim 1, wherein the annealing of the substrate is performed in the second reaction chamber.

3. The metal organic chemical vapor deposition method of claim 1, wherein the annealing of the substrate is performed in the buffer chamber.

4. The metal organic chemical vapor deposition method of claim 1, wherein the transferring of the substrate from the first reaction chamber to the second reaction chamber comprises:
    transferring the substrate from the first reaction chamber to the buffer chamber; and
    transferring the substrate from the buffer chamber to the second reaction chamber.

5. The metal organic chemical vapor deposition method of claim 1, wherein after the transferring of the substrate from the first reaction chamber to the second reaction chamber, the method further comprises transferring another substrate into the first reaction chamber.

* * * * *